(12) United States Patent
Thedrez

(10) Patent No.: US 7,254,154 B2
(45) Date of Patent: Aug. 7, 2007

(54) DFB LASER WITH A DISTRIBUTED REFLECTOR AND PHOTONIC BAND GAP

(76) Inventor: Bruno Thedrez, 2, rue de Chatillon, 75014 Paris (FR)

( * ) Notice: Subject to any disclaimer, the term of this patent is extended or adjusted under 35 U.S.C. 154(b) by 230 days.

(21) Appl. No.: 10/520,837

(22) PCT Filed: Jul. 4, 2003

(86) PCT No.: PCT/FR03/02063

§ 371 (c)(1),
(2), (4) Date: Jan. 7, 2005

(87) PCT Pub. No.: WO2004/008591

PCT Pub. Date: Jan. 22, 2004

(65) Prior Publication Data

US 2005/0232329 A1    Oct. 20, 2005

(30) Foreign Application Priority Data

Jul. 8, 2002 (FR) ................... 02 08543

(51) Int. Cl.
*H01S 3/08* (2006.01)
(52) U.S. Cl. .......................... 372/96; 372/99
(58) Field of Classification Search .................. 372/96
See application file for complete search history.

(56) References Cited

U.S. PATENT DOCUMENTS 5,684,817 A    11/1997  Houdre et al.
6,674,778 B1 *  1/2004  Lin et al. ................. 372/46.01
6,744,804 B2 *  6/2004  Deng et al. .................... 372/92

FOREIGN PATENT DOCUMENTS

EP    0 468 482    1/1992
JP    61218191    9/1986

OTHER PUBLICATIONS

T. D. Happ, M. Kamp, A. Forchel, Ridge Waveguide Lasers With 2D Photonic Crystal Mirrors, Proceedings of the 26th International symposium On Compound Semiconductors, Berlin, Aug. 22, 26, 1999, Institute of Physics Conference Series, London: IOP, GB, vol. Nr. 166, Aug. 22, 1999, pp. 411-414, XP000921543, ISBN: 0-7503-0704-8 Figure 1.

(Continued)

*Primary Examiner*—Armando Rodriguez
(74) *Attorney, Agent, or Firm*—Patterson & Sheridan, LLP

(57) ABSTRACT

The invention relates to a semiconductor laser consisting of an active waveguide comprising an active region surrounded by a filling material and which is coupled to a distributed reflector. Said distributed reflector is made from the aforementioned filling material and is disposed along the length of the lateral sides of the active region essentially parallel to same and in the form of a structuring having a photonic band gap along the longitudinal axis of the laser. According to the invention, the structuring defines a first photonic crystal with columns forming diffracting elements, said crystal comprising a mesh having dimensions of the order of the wavelength of photons in the guided mode which circulate in the active waveguide.

18 Claims, 2 Drawing Sheets

OTHER PUBLICATIONS

Figure 1:
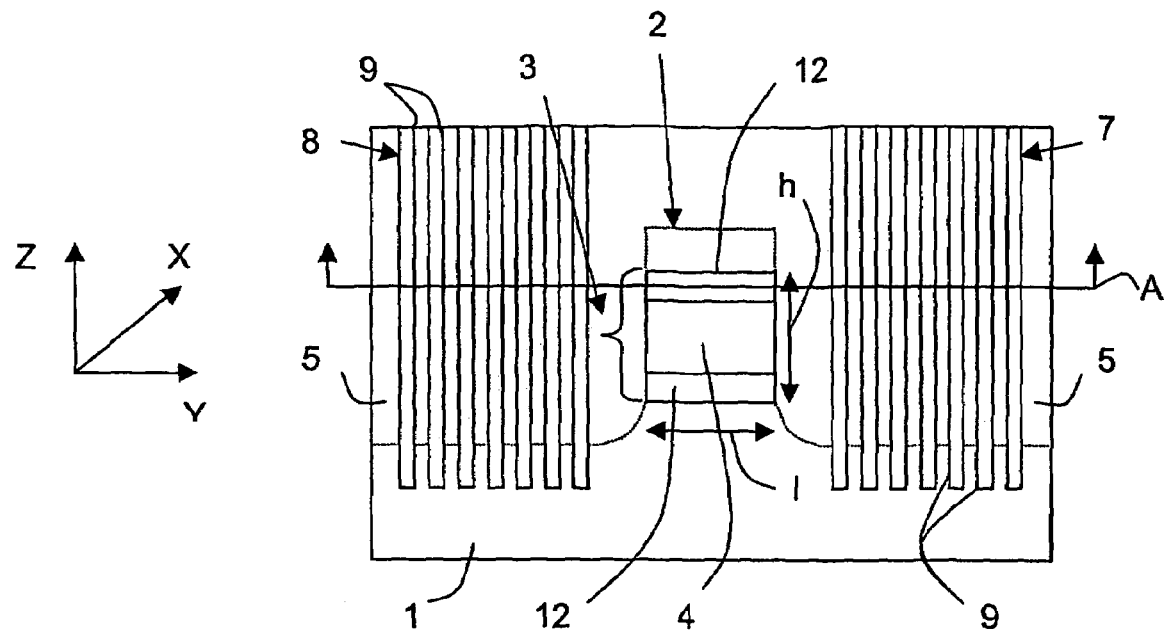

I. Vurgaftman and J R. Meyer, Photonic-Crystal Distributed-Feedback Lasers, Applied Physics Letters, American Institute of Physics, New York, U.S., vol. 78, No. 11, Mar. 12, 2001, pp. 1475-1477, XP001015018, ISSN: 0003-6951, Figure 1.

M. Kamp, J. Hofmann, F Schafer, M. Reinhard, M. Fischer, T. Bleuel, J. P. Reithmaier, and A. Forchel, Lateral Coupling—A Material Independent Way To Complex Coupled DFB Lasers, Optical Materials, Elsevier Science Publishers B.V. Amsterdam, NL, vol. 17, No. 1-2, Jun. 2001, pp. 19-25, XP004254783, ISSN: 0925-3467, Figure 1.

PCT Search Report, International Application No. PCT/FR 03/02063, dated Feb. 2, 2004.

* cited by examiner

DFB LASER WITH A DISTRIBUTED REFLECTOR AND PHOTONIC BAND GAP

The invention relates to the field of optical devices, more specifically to that of DFB (Distributed FeedBack) semiconductor lasers.

As is known by one skilled in the art, DFB lasers, such as for example those called "buried ribbon" lasers, generally include an active waveguide which classically comprises an active region buried in a filler material, and coupled to structures which form a diffraction grating (or distributed reflector) due to a periodic variation of the index. In terms of the guiding structure, the active region can be incorporated into the heart of the guide, whereas the filler material which surrounds it, with a smaller index, corresponds to its coating.

The distributed reflector causing a periodic modification of the index of refraction, only the photons emitted by the active region and having a wavelength dictated by the reflector contribute to the laser oscillation. Consequently a DFB laser theoretically exhibits a narrow spectral footprint which makes it a single-mode laser.

But, in practice, this is not exactly the case due to the complexity of the processes currently in use to produce distributed reflectors. Actually it is necessary for the reflections at the level of the ends of the laser (typically the opposing faces of the component) to be in phase with the reflections induced by the grating of the distributed reflector. These phase conditions can only be obtained by positioning the laser face in a very specific manner relative to the diffraction grating, and with a precision significantly less than the wavelength.

Moreover, this manner of producing distributed reflectors allows the grating strength to be varied only with difficulty, i.e. the coupling coefficient between the optical wave and the grating, from one laser to another on the same wafer. Similarly, it is difficult to vary the grating strength with any precision along the longitudinal axis of the laser.

Approaches have been advanced in an attempt to eliminate these difficulties. One approach simply consists in devoting one wafer to each type of distributed reflector. But this approach is costly. Another approach is to disorientate the grating to reduce its grating strength. But this approach changes the Bragg wavelength of the grating, and moreover photons can be diffracted in unwanted directions. It no longer makes it possible to vary the grating strength along the longitudinal axis of the DFB laser.

Thus the object of the invention is to eliminate the aforementioned difficulties in whole or in part.

To do this the invention proposes a semiconductor laser of the type described in the introduction and according to which the distributed reflector is implemented in a filler material which surrounds the active region of the active waveguide, along at least one of the lateral sides (preferably two), and essentially parallel to the latter in the form of at least one configuration with a photonic band gap along the longitudinal axis of the laser.

Classically, it is considered that a laser structure extends in three direction perpendicular to one another, one direction, which is called "longitudinal" (X), defining the longitudinal axis of the laser relative to which its longitudinal extension L (or length) is defined, one direction called "lateral" (Y) relative to which for example the lateral extension I (or width) of the active region of the waveguide is defined, and one direction called "vertical" (Z) in the direction of stacking of the layers and relative to which for example the vertical extension h (or height) of the active region of the waveguide is defined. Accordingly, the phrase "the distributed reflector is implemented along at least one of the lateral sides of the active region" means that the reflector extends over the entire length L of the active region of the laser, or over a portion of it, essentially parallel to the plane defined by the vertical (Z) and longitudinal (X) directions. The expressions "longitudinal extension", "lateral extension" and "vertical extension" are used in preference to the more common terms "length", "width" and "height" respectively because they are intended to designate the geometrical characteristics of the structures and not simple dimensions.

Moreover, "photonic band gap configuration" is defined as a n-dimensional grating (n being preferably equal to 2, but can likewise be equal to 1 or to 3), with physical properties which allow control of light propagation by precluding it for certain wavelengths in certain three-dimensional directions.

The distributed reflector as claimed in the invention is thus used to filter, in the longitudinal direction, certain wavelengths, and not to ensure lateral and vertical confinement, which is ensured by the very composition of the buried active region. This makes it possible especially to fix the grating strength at any desired value by acting primarily on the distance separating the grating from the active layer.

The first configuration extends preferably over the entire lateral extension (or width) of the filler material placed on either lateral side of the active region. But it could equally well extend over one portion solely of this lateral extension.

Moreover, the first configuration extends over one portion of at least the extension of the active region following the vertical direction, preferably over its entirety, and over one portion or the entirety of the height of the filler material.

In one preferred embodiment, the first configuration is a first photonic crystal formed by localized etching of the filler material in such a manner as to form hollow columns there or to leave columns of material remaining there, these columns comprising a periodic grating of diffracting elements with a lattice in the horizontal plane, which lattice has dimensions of roughly the wavelength of laser operation. Again the columns more preferably extend essentially parallel to the direction of stacking of the layers.

In addition, the lattice of the grating of the first photonic crystal preferably has the shape of a convex polygon, with a height which is selected as a function of the operating wavelength under study. This convex polygon is preferably a regular polygon (i.e. with all sides equal) such as a square, an equilateral triangle, or a diamond.

The first configuration is spaced away from the active region by a distance which is selected as a function of the grating strength which is required for the distributed reflector, such that the photons with a wavelength different from that of the photons in the mode under study are extracted.

According to another feature of the invention, this distance can be either constant or variable along the longitudinal extension (or length) L of the active region such that the grating strength can be varied longitudinally. The interest in this first arrangement is that it allows lasers with improved spectral selectivity to be implemented, for example, by controlling the longitudinal distribution of the power density in the laser structure.

According to another feature of the invention, the filler material of the active waveguide can be provided likewise on at least one of the longitudinal ends of the active region, in order to obtain, at a distance $\delta L$ from the longitudinal ends of the first configuration, reflection means implemented in the form of a second photonic band gap configuration and extending essentially parallel to the lateral extension of the active region. This second configuration is used as the rear mirror for the DFB laser. Moreover the distance δL can be chosen to be essentially equal to a whole number times half the wavelength of the photons in the guided mode (i.e. half the wavelength of laser operation in the filler material) such that the first and second configurations define a Fabry-Perot type resonant cavity.

Preferably this second configuration extends over the entire lateral extension (or width) of the waveguide. But it could extend over the width of the active region and all or part of the lateral extension of the filler material which has been placed on either lateral side of the active region (in the zones in which the first configuration is formed). Likewise, it extends preferably over the entire height (stacking direction) of the active region, and more preferably again over the entire height of the filler material which surrounds especially the active region.

Equally preferably the second configuration is a second photonic crystal formed by localized etching of the filler material in such a manner as to form hollow columns there or to leave columns of material remaining there, these columns comprising a periodic grating of diffracting elements with a lattice in the horizontal plane, which lattice has dimensions of roughly the wavelength of laser operation.

In this case, it is preferable that the columns extend essentially parallel to the vertical extension (or height h) of the active region, over all or part (at least the active region) of the waveguide. It is likewise advantageous for the lattice of the grating of the second photonic crystal to have the shape of a convex polygon, preferably a regular polygon.

The convex polygons of the first and second photonic crystals are advantageously linked to essentially identical Bragg wavelengths. Moreover, in one preferred embodiment the first and second photonic crystals are composed of convex polygons of different types.

Figure 2:
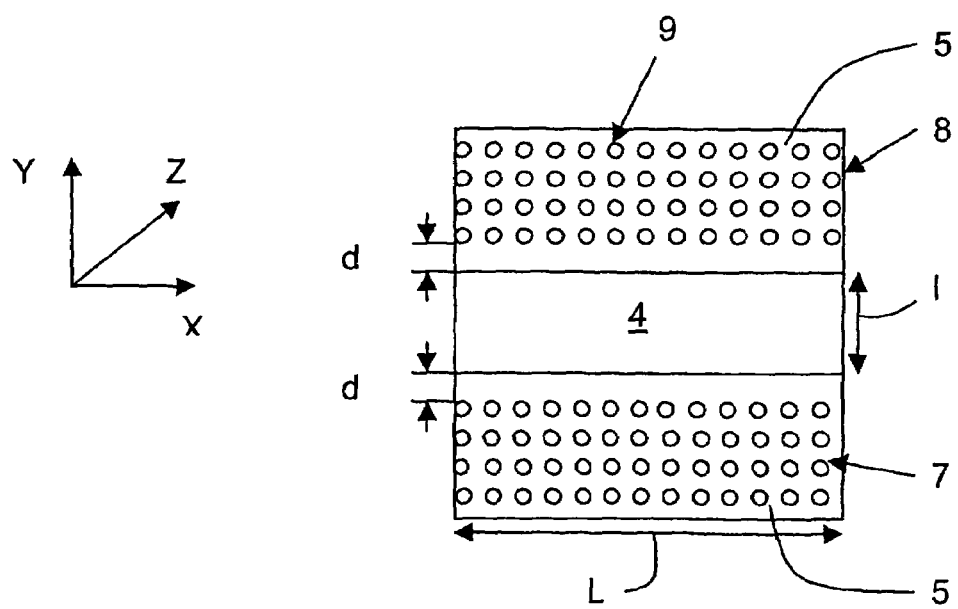
Figure 3:
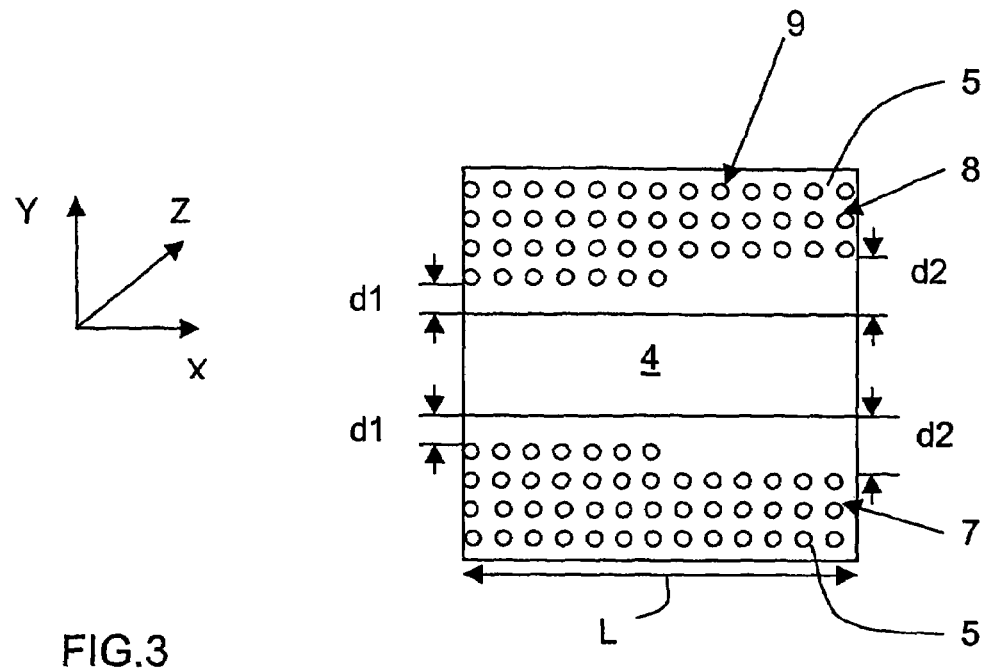
Figure 4:
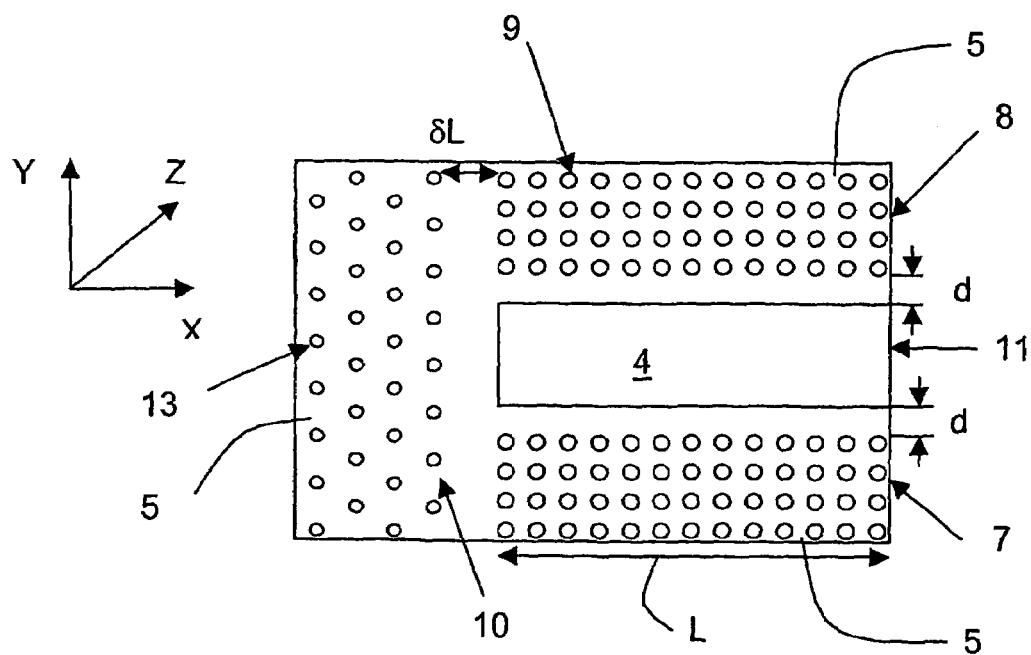

Other characteristics and advantages of the invention will become apparent by reading the following detailed description and inspecting the attached drawings, where:

FIG. 1 is a schematic cross section, in the plane (YZ), of a DFB laser as claimed in the invention, equipped with a first type of photonic crystal, FIG. 2 is a cross section along axis A of FIG. 1 (in plane (XY)), FIG. 3 is a section identical to that from FIG. 2, but showing a DFB laser equipped with a second type of photonic crystal, FIG. 4 is a section identical to that from FIG. 2, but showing another DFB laser as claimed in the invention, equipped with a first photonic crystal defining the distributed reflector, and with a second photonic crystal defining the rear reflector.

The dimensions of the various components comprising the DFB lasers shown in the figures are not representative of their actual respective dimensions.

The coordinate system (X, Y, Z) shown in FIGS. 1 to 4 defines the perpendicular directions in which the DFB laser structure of the invention extends. The X axis defines the longitudinal direction of the laser (along its length L). The Y axis defines the lateral direction of the laser (along its width l). And the Z axis defines the vertical direction of stacking of the layers (by agreement, the "lower part" of the laser is the bottom of FIG. 1, and the "upper part" of the laser is the top of FIG. 1).

Reference is made first of all to FIGS. 1 and 2 to describe a first embodiment of a DFB laser as claimed in the invention.

This DFB laser comprises first of all a substrate 1 (for example of type n) made of a semiconductor III-V material such as for example InP or GaAs. It likewise comprises an active waveguide 3 formed by an etching technique, located above the substrate 1 and composed of an active region 4 in which the photons of the guided mode are produced, and vertically surrounded by an undoped optical confinement material 12. The DFB laser finally comprises a filler material 5, for example, p doped InP, laterally and vertically surrounding the active waveguide 3. In FIG. 1 the boundary 2 between the etched region comprising the active waveguide 3 and the region containing the filler material 5 is shown by the dotted lines. This example of a DFB laser is of the type called "buried ribbon" due to its manner of implementation.

The active waveguide 3 is coupled to a distributed reflector made here as two identical diffraction gratings 7, 8 which have been formed in the lateral parts of the filler material 5 which are located on either longitudinal (or lateral) side of the active region 4, defined by the plane (X,Z) and essentially parallel to these sides.

Each grating 7, 8 is a specific configuration of the filler material 5, called a "photonic band gap" configuration. Accordingly in the following a grating is incorporated into its configuration. This type of n-dimensional grating (n being preferably equal to 2, but can likewise be equal to 1 or to 3) is familiar to one skilled in the art. It is described specifically in the article of E. Yablanovitch, J. Opt. Soc. Am. B 10, 283 (1993) "Photonic bandgap structures". As its name indicates, it is designed in such a way as to have one or more energy bands which are forbidden to certain photons of light which are emitted in the active region 4. It thus makes it possible to control (filter) the propagation of light or even to prevent propagation of certain of these wavelengths.

As stated above, the gratings 7, 8 are thus used to filter certain wavelengths and not to ensure lateral and vertical confinement, which is ensured by the very composition of the active region 4 and the fact that it is surrounded by optical confinement material 12 and filler material 5. But they have a complementary function. Their photonic band gap is actually selected to ensure "longitudinal" optical confinement for light with the desired wavelength of operation. This light must be able to penetrate into the grating laterally, but it "sees" the photonic band gap in the longitudinal direction (X axis). In other words, this forbidden energy band in some way prevents propagation of the light in the longitudinal direction (X axis) in the grating, and according to its phase relation to the faces, induces situations of resonance which make it possible to choose the wavelength of the guided mode. It can likewise exhibit this characteristic as inhibition of longitudinal propagation by coupling between the grating and the wave emitted as a function of the reflection conditions of the faces.

Preferably, the configuration 7, 8 extends entirely over the length L of the active region 3. Likewise preferably the configuration 7, 8 extends more or less over the entirety of the width of the filler material 5 which is located on either side of the active region 4. In fact, it is important that the configuration extends over a portion of the optical mode. Preferably still the configuration 7, 8 extends entirely over the height of the filler material 5 which is located on either longitudinal (or lateral) sides of the active region 4. As shown in FIG. 1, the configuration 7, 8 can likewise extend into a portion of at least the substrate 1.

In the example shown in FIG. 2, the configuration 7, 8 defines a photonic crystal of holes in the form of columns 9 which extend essentially in the vertical direction (Z axis)

and comprise diffracting elements which ensure periodic variation of the dielectric constant. These holes 9 can be formed using localized etching techniques such as dry etching and electron beam etching, quite familiar to one skilled in the art. This implementation of the distributed reflector avoids stages of regrowing which are often delicate and costly.

Alternatively, a photonic crystal composed of columns of material could be implemented. The columns are also formed by localized etching of the filler material, but in such a manner as to allow the columns of material to remain there.

Viewed in a horizontal plane, the grating of the photonic crystal is periodic and has a lattice in the shape of a convex polygon. The number of periods and the spacing of the grating along the X axis (tied to the dimension of the lattice) and the dimensions of the holes (or columns) are chosen as a function of the wavelength of laser operation under study. This spacing is typically on the order of this wavelength. Moreover, the type of grating (just like the spacing) is chosen as a function of the desired photonic band gap.

As shown, this type is preferably a square. But it could also be equilateral triangles or diamonds which have sides with essentially equal sizes.

The photonic crystal, specifically due to its implementation, enjoys one major advantage. It in fact makes it possible to precisely control what is called by one skilled in the art the grating strength or coupling coefficient which characterizes the intensity of coupling between the grating and the waves linked to the emitted photons. Due to the fact that the grating is located in the filler material, outside of the active material, this grating strength in fact depends first and foremost on the distance d which separates the side of the grating 7, 8 from the longitudinal side (or lateral side) of the active region 4 and which is a significant parameter with regard to filtration of the photon wavelength. This leads to the fact that adjustment of the coupling force can be obtained by simple dimensioning of the distance d in a manner essentially independent of the other parameters of the laser structure.

As shown in the embodiment from FIG. 2, the distance d can be constant. But, as shown in the embodiment from FIG. 3, the distance d can vary along the longitudinal extension L (X axis) of the active region 4. In this version of FIG. 2, the photonic crystal 7, 8 exhibits a "left" portion located at a distance d1 from the active region 3, and a "right" portion located at a distance d2 from this same active region. In this example, the right and left portions have the same lattice shape (square), but they could have different shapes to make available at the same time different photonic band gaps and different grating strengths. Generally the law of variation of this distance as a function of the longitudinal position depends on the studied effect and can be obtained using simulation software available to optoelectronic component development teams.

Typically the spectral selectivity of the laser can thus be optimized. This implementation allows for example spatial compensation which is called by one skilled in the art "hole burning" which results in interference appearing in the grating due to the propagation of the field in opposite directions. Actually when the laser structure is essentially uniform, the distribution of the power density generally has troughs and loops. At high operating power of the laser, the carrier density in the active region is thus found saturated at the level of the loops, and this inhomogeneous distribution along the structure degrades the spectral selectivity. The invention will henceforth make it possible to easily control the power density distribution in the laser structure.

Another version can be likewise envisioned in which the distance d is constant along the active region 4, but with a diffraction grating composed of two or more photonic crystals, with different lattices to make available locally different photonic band gaps.

The distance d or distances di (i=1, 2 in FIG. 3) are preferably controlled by masking during the lithography phase, ordinarily on the nanometer scale.

Reference is made to FIG. 4 to describe another embodiment of the DFB laser as claimed in the invention.

This is a version of the laser shown in FIGS. 1 to 3, in which the rear (or left) longitudinal end of the active region 4 is likewise surrounded by filler material 5 in which a rear reflecting mirror 10 is formed which has been implemented in the form of a photonic band gap configuration, while the front longitudinal end, opposite, is a classical mirror surface 11 of the component, a surface equipped with an antireflection coating. In one version, each surface of the longitudinal end could be equipped with a photonic band gap configuration.

This implementation is designed to reduce or suppress the variations of spectral behavior and/or of the threshold and/or of the efficiency and/or of other parameters which arise between DFB laser of the same type due to variations of the magnitude of the wavelength fraction of face positions relative to the distributed reflectors.

The configuration of the rear mirror 10 is similar to that of the distributed reflectors 7, 8 presented with reference to FIGS. 1 and 2. It could accordingly be implemented during the same stage. It extends in the filler material essentially perpendicular to the plane (X, Y) and thus essentially in the vertical direction Z.

This configuration 10 (which is incorporated below into the rear mirror) extends over a portion at least of the width I of the waveguide 3, and at least over the entire width of the active region 4 and the zone of lateral extension of the first configuration 7, 8. Moreover, this configuration extends at least over the height of the active region 4, but preferably over the entire height h of the waveguide 3.

In addition, as in the first configuration, this second configuration 10 defines essentially a second photonic crystal of holes 13 which extends essentially along the vertical direction (Z axis) and comprises diffracting elements which ensure periodic variation of the dielectric constant. Alternatively, a photonic crystal of columns could be implemented in place of the photonic crystal of holes.

Like the first photonic crystal, this second photonic crystal is preferably a periodic grating and has a lattice in the form of a convex polygon. Likewise, the number of periods and the spacing of the grating along the X axis (tied to the dimension of the lattice) and the dimensions of the holes (or columns) are chosen as a function of the wavelength of laser operation under study. This spacing is ordinarily of the magnitude of this wavelength. Moreover, the type of grating (just like the spacing) is chosen as a function of the desired photonic band gap.

As shown in FIG. 4, this type is preferably an equilateral triangle lattice. But it could equally well be squares (possibly identical to those of the first photonic crystal) or diamonds with sides of essentially equal size. In fact the lateral grating 7, 8 must have a band gap along the longitudinal axis, but preferably not along the lateral axis, while the grating 10 at the end of the laser can preferably have a band gap in these two directions (lateral and longitudinal).

Convex polygons of the first and second photonic crystals are preferably dimensioned such that they have essentially identical Bragg wavelengths.

The second configuration 10 is formed at a distance δL from the rear longitudinal end of the first configuration 7, 8. This implementation of the reflector using the second photonic crystal allows precise control, ordinarily on the nanometer scale, of the distance δL which contributes significantly to the properties of the DFB laser, and especially to its rejection rate of secondary modes ("SMSR"), its threshold and its efficiency.

Moreover, this distance δL can be chosen to be essentially equal to a whole number times half the wavelength of the photons in the guided mode (i.e. half the operating wavelength in the filler material) such that the first and second configurations define a Fabry-Perot type resonant cavity tuned to the wavelength of laser operation.

A DFB laser equipped with a distributed reflector with variable distance di of the type shown in FIG. 3 can be likewise equipped with a rear mirror and/or a front mirror with a photonic band gap, of the type shown in FIG. 4.

Typical dimensions of the elements of a structure of the type shown in FIG. 4 are given below, by way of a nonrestrictive example.

In order for example to implement a set of laser chips covering the wavelengths of band C on the same board, a broadband end mirror can be formed comprising twenty rows of equilateral triangular crystals, with an air filling factor of roughly 0.3 and a period (distance between the centroids of the triangles) of roughly 340 nm, for light incident in the direction parallel to the mid-perpendicular of the triangles. The period can exhibit variations of roughly 10 nm, given that broadband reflections of roughly 100 nm are expected.

The lateral reflector, with an air filling factor of roughly 0.3, can be implemented using a single one-dimensional (1D) grating with modulation following the X axis and a Bragg wavelength matched to the laser emission wavelength. To obtain an emission wavelength of roughly 1550 nm, with a device which has an effective index of roughly 3.2, the period should be roughly 242.2 nm. The lateral extension of the crystal must be at least equal to that of the transverse mode, or typically 10 microns from each side.

The separation distance between the longitudinal (or lateral) sides of the active region 4 and the lateral reflectors placed on either of these sides is on average roughly a micron. But it can vary locally from 0 to 10 microns in order to cover a wide range of grating strengths. Moreover, for a tolerance of roughly 10 nm over the laser emission wavelength, it is necessary to adjust the period to approximately ±0.8 nm.

The optical distance between the lateral reflectors and the end reflector can be equal to roughly 242.2 nm in order to be roughly half the wavelength of laser operation in the filler material. Moreover, the same tolerance as that accepted for the lateral reflectors can be envisioned for this optical distance.

This structure makes it possible to operate with a wavelength of roughly 1550 nm in air.

The invention is not limited to the above-described implementations, only by way of example, but it encompasses all versions which can be envisioned by one skilled in the art within the framework of the following claims.

The invention claimed is:

1. A semiconductor laser comprising: an active waveguide extending in the longitudinal, lateral and vertical directions, comprising an active region, surrounded by a filler material and coupled to a distributed reflector, wherein said distributed reflector is implemented in said filler material along at least one of the lateral sides of the active region and essentially parallel thereto, in the form of at least a first photonic crystal with a photonic band gap along said longitudinal axis, said first photonic crystal comprising a plurality of columns forming a periodic grating of diffracting elements with a lattice in the horizontal plane such that said lattice of grating has a shape of an equilateral triangle.

2. The laser of claim 1, wherein said first configuration extends over one portion at least of the extension of the active region in the vertical direction, and over one portion at least of the extension of the filler material in the vertical direction.

3. The laser of claim 1, wherein said first photonic crystal is formed by localized etching of the filler material in such a manner as to form hollow columns there or to leave columns of material remaining there, these columns comprising the periodic grating of diffracting elements with the lattice in the horizontal plane, which lattice has dimensions of roughly the wavelength of laser operation.

4. The laser of claim 3, wherein said columns extend essentially parallel to said vertical direction of the active region.

5. The laser of claim 1, wherein said first configuration is spaced away from the lateral sides of the active region by an essentially constant distance.

6. The laser of claim 1, wherein said first configuration is spaced away from the lateral sides of the active region by a distance which varies along the extension of said active region in the longitudinal direction.

7. The laser of claim 1, wherein said active waveguide comprises, on at least one of the longitudinal ends of the active region, a filler material in which, at a distance δL from the first configuration, reflection means are formed which are implemented in the form of a second photonic band gap configuration and extending essentially parallel to the extension of the active region in the lateral direction.

8. The laser of claim 7, wherein said second configuration extends at least over the entire extension of the active region in the vertical direction.

9. The laser of claim 7, wherein said second configuration extends over the entire extension of the active region in the lateral direction, and over one portion at least of the extension of the filler material in the lateral direction.

10. The laser of claim 7, wherein said second configuration is a second photonic crystal formed by localized etching of the filler material in such a manner as to form hollow columns there or to leave columns of material remaining there, these columns comprising a periodic grating of diffracting elements with a lattice in the horizontal plane, which lattice has dimensions of roughly the wavelength of laser operation.

11. The laser of claim 10, wherein said columns extend essentially parallel to said vertical direction of the active region.

12. The laser of claim 10, wherein said lattice of the grating of the second first photonic crystal has the shape of a convex polygon.

13. The laser of claim 12, wherein said polygon is a regular polygon.

14. The laser of claim 7, wherein said distance δL is essentially equal to a whole number times half the wavelength of laser operation in the filler material such that the first and second configurations define a Fabry-Perot type resonant cavity.

15. A semiconductor laser, comprising:
an active waveguide extending in the longitudinal, lateral and vertical directions, the active waveguide comprising:

an active region, surrounded by a filler material; and at least one distributed reflector coupled to the active region, wherein said distributed reflector is implemented in said filler material in the form of at least a first photonic crystal with a photonic band gap along said longitudinal axis, said first photonic crystal includes a plurality of columns forming a periodic grating of diffracting elements, whereby said plurality of columns are positioned along at least one of the lateral sides of the active region such that an end of said plurality of columns is spaced from the lateral side at a first distance and another end of said plurality of columns is spaced from the lateral side at a second larger distance.

16. A semiconductor laser, comprising:

an active waveguide extending in the longitudinal, lateral and vertical directions, the active waveguide comprising:

an active region, surrounded by a filler material;

at least one first distributed reflector coupled to the active region, wherein said distributed reflector is implemented in said filler material along at least one of the lateral sides of the active region and essentially parallel thereto, in the form of at least a first photonic crystal with a photonic band gap along said longitudinal axis; and at least one second distributed reflector coupled to the active region, wherein said distributed reflector is implemented in said filler material along at least one of the longitudinal ends of the active region and essentially parallel thereto, in the form of at least a second photonic crystal with a photonic band gap configuration and extending essentially parallel to the extension of the active region in the lateral direction.

17. The semiconductor laser of claim 16, wherein each photonic crystal includes a plurality of columns forming a periodic grating of diffracting elements with a lattice in the horizontal plane such that said lattice of grating has a shape of a convex polygon.

18. The semiconductor laser of claim 16, wherein the convex polygon is dimensioned such that said first photonic crystal and said second photonic crystal have essentially identical Bragg wavelengths.

* * * * *